United States Patent
Goel

(10) Patent No.: US 9,599,670 B2
(45) Date of Patent: *Mar. 21, 2017

(54) CIRCUIT AND METHOD FOR MONOLITHIC STACKED INTEGRATED CIRCUIT TESTING

(71) Applicant: Taiwan Semiconductor Manufacturing Company, Ltd., Hsin-Chu (TW)

(72) Inventor: Sandeep Kumar Goel, Dublin, CA (US)

(73) Assignee: Taiwan Semiconductor Manufacturing Company Ltd, Hsin-Chu (TW)

( * ) Notice: Subject to any disclaimer, the term of this patent is extended or adjusted under 35 U.S.C. 154(b) by 789 days.

This patent is subject to a terminal disclaimer.

(21) Appl. No.: 14/030,684

(22) Filed: Sep. 18, 2013

(65) Prior Publication Data

US 2015/0077147 A1  Mar. 19, 2015

(51) Int. Cl.
*G01R 31/3185* (2006.01)
*G01R 31/28* (2006.01)
*G01R 31/317* (2006.01)

(52) U.S. Cl.
CPC .. *G01R 31/318513* (2013.01); *G01R 31/2882* (2013.01); *G01R 31/31707* (2013.01); *G01R 31/31718* (2013.01)

(58) Field of Classification Search
CPC ...... G01R 31/318513; G01R 31/31718; G01R 31/31707; G01R 31/2882; G01R 31/3185; G01R 31/318522; G01R 31/318533; G01R 31/3187; G01R 31/318536; G06F 11/267; G06F 11/27
USPC ................................ 714/726, 727, 729, 731
See application file for complete search history.

(56) References Cited

U.S. PATENT DOCUMENTS

| | | | | |
|---|---|---|---|---|
| 6,423,558 | B1* | 7/2002 | Maeda | H01L 22/20 |
| | | | | 257/E21.525 |
| 9,110,136 | B2* | 8/2015 | Goel | G01R 31/3177 |
| 9,222,983 | B2* | 12/2015 | Goel | G01R 31/318513 |
| 2007/0157058 | A1* | 7/2007 | Park | G01R 31/31855 |
| | | | | 714/727 |
| 2012/0313647 | A1* | 12/2012 | Carpenter | G11C 29/025 |
| | | | | 324/612 |

OTHER PUBLICATIONS

M. Siebert and E. Gramatová, "Delay Fault Coverage Increasing in Digital Circuits," Digital System Design (DSD), 2013 Euromicro Conference on, Los Alamitos, CA, 2013, pp. 475-478.*

(Continued)

*Primary Examiner* — Cynthia Britt
(74) *Attorney, Agent, or Firm* — Haynes and Boone, LLP

(57) ABSTRACT

A monolithic stacked integrated circuit (IC) is provided with a known-good-layer (KGL) path delay test circuit and at least a portion of a critical path in one of its layers. The test circuit includes a plurality of inputs, outputs, a flip-flop coupled to the at least a portion of the critical path and a multiplexer coupled to the flip-flop and to a second layer of the IC. The test circuit further includes a control element such that path delay testing of the IC may be conducted on a layer-by-layer basis.

20 Claims, 21 Drawing Sheets

(56) References Cited

OTHER PUBLICATIONS

C. Metzler, A. Todri-Sanial, A. Bosio, L. Dilillo, P. Girard and A. Virazel, "TSV aware timing analysis and diagnosis in paths with multiple TSVs," 2014 IEEE 32nd VLSI Test Symposium (VTS), Napa, CA, 2014, pp. 1-6.*
S. Huang et al., Small delay testing for TSVs in 3-D ICs, in Design Automation Conference (DAC), pp. 1031-1036, 2012.*
Sandeep Kumar Goel, U.S. Appl. No. 14/027,976 entitled "Circuit and Method for Monolithic Stacked Integrated Circuit Testing," filed Sep. 16, 2013. 28 pages of text, 22 pages of drawings.

\* cited by examiner

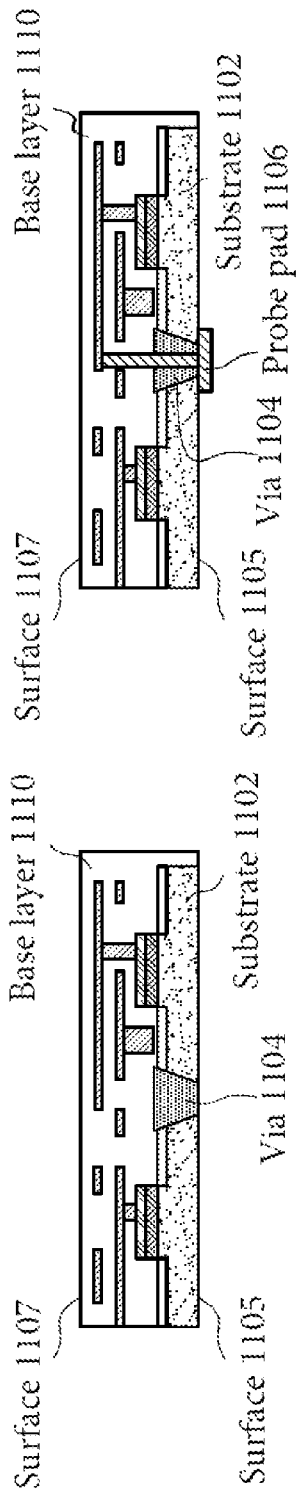
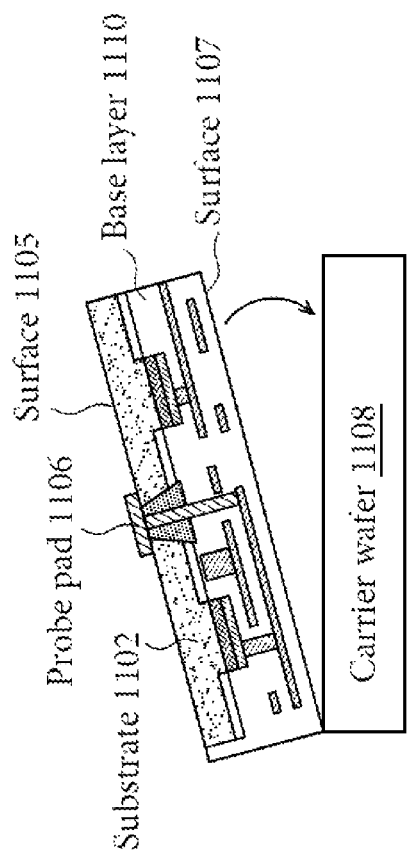
FIG. 11a
FIG. 11b
FIG. 11c

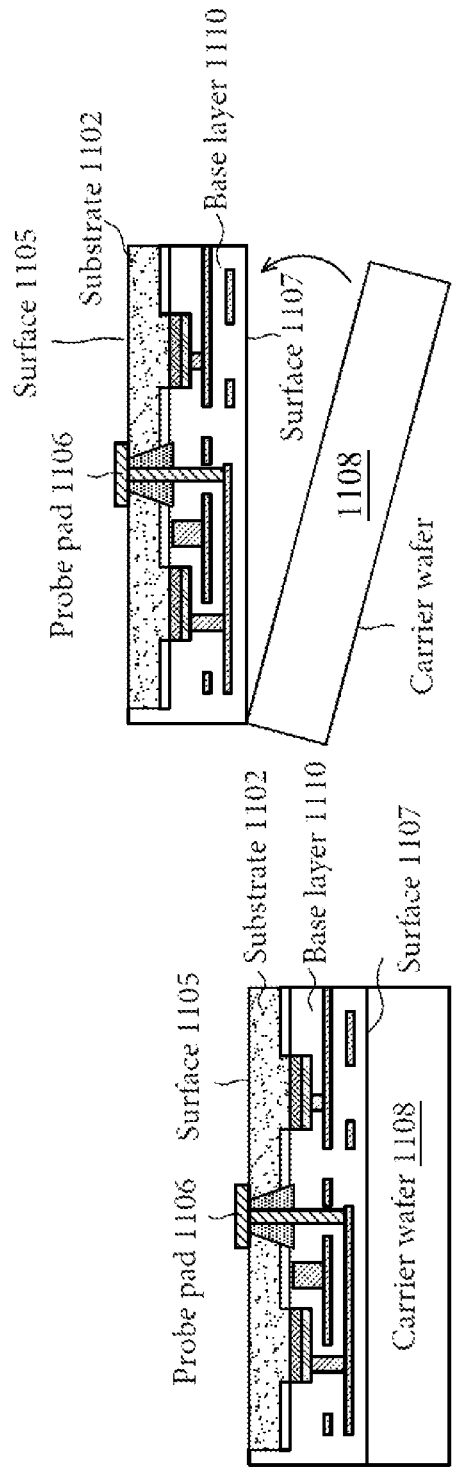

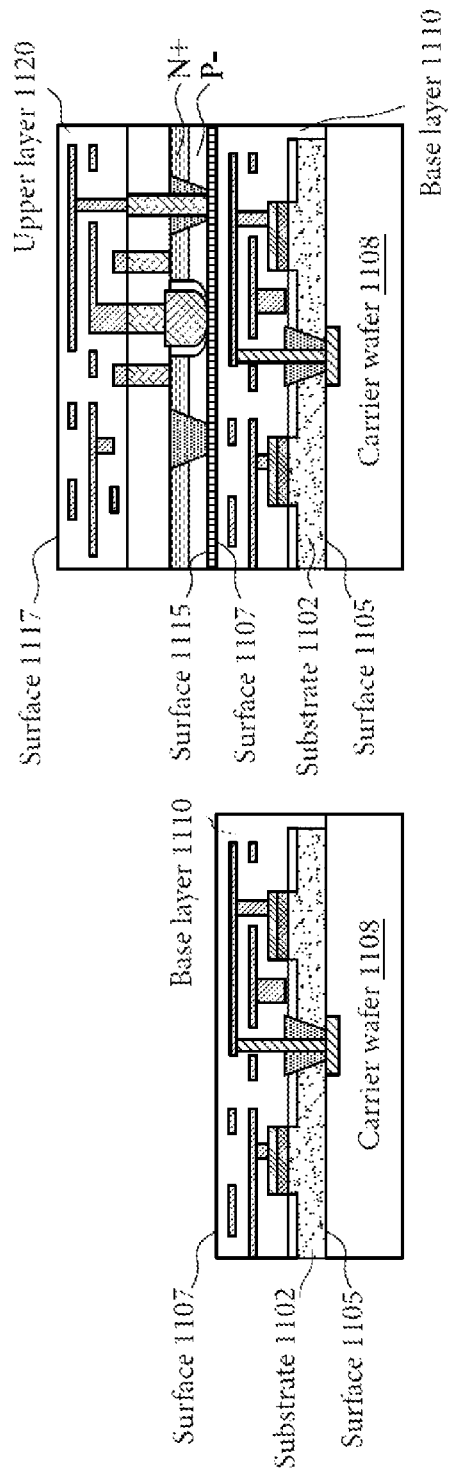

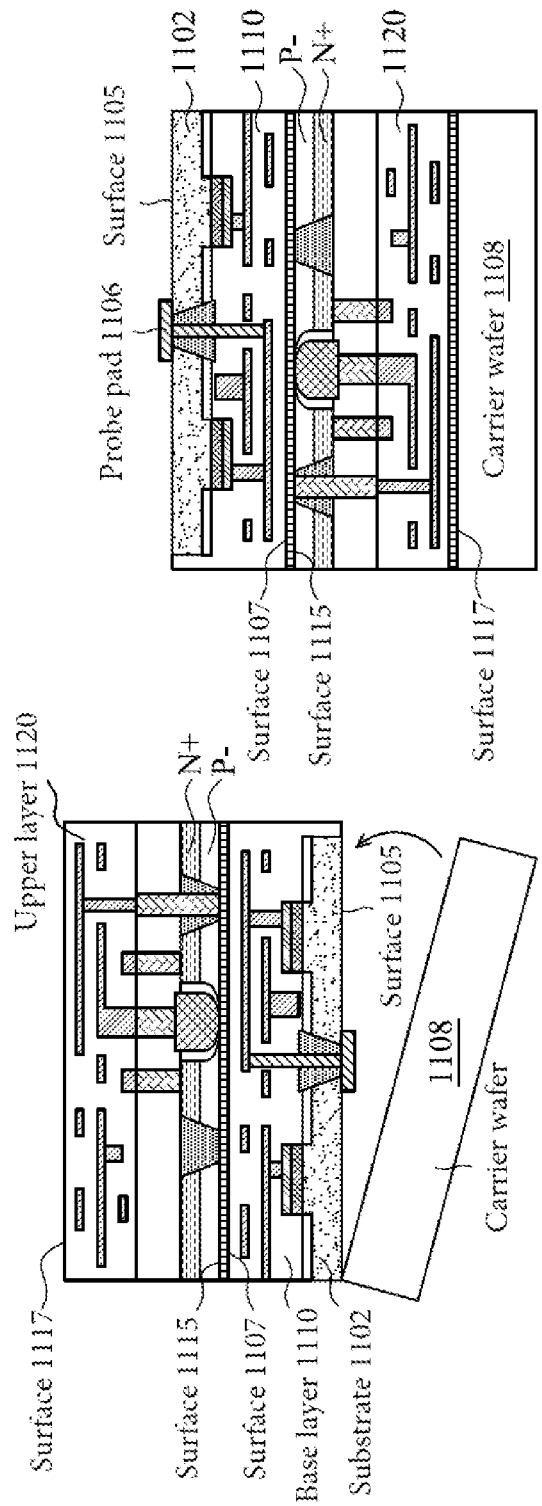

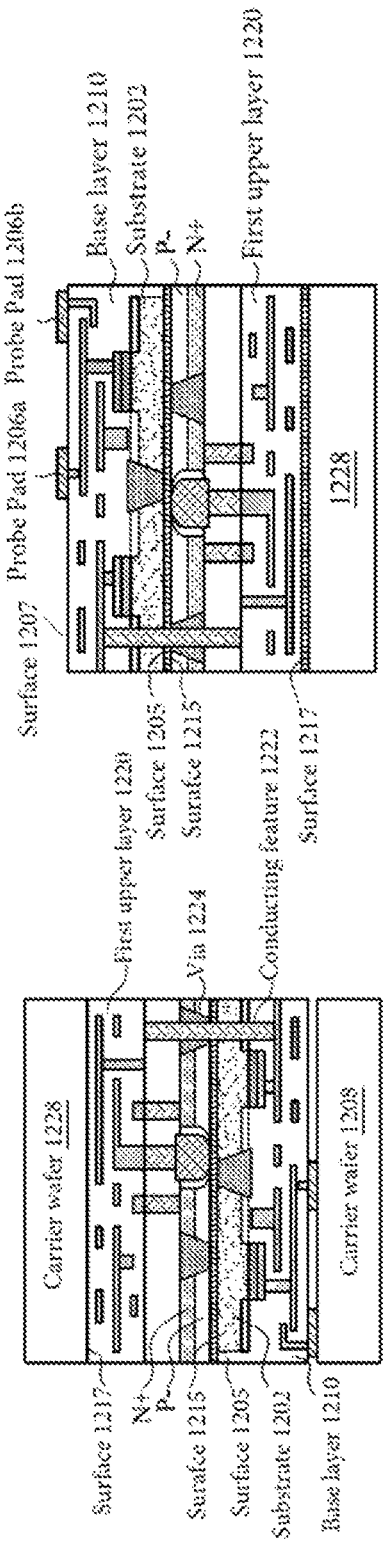

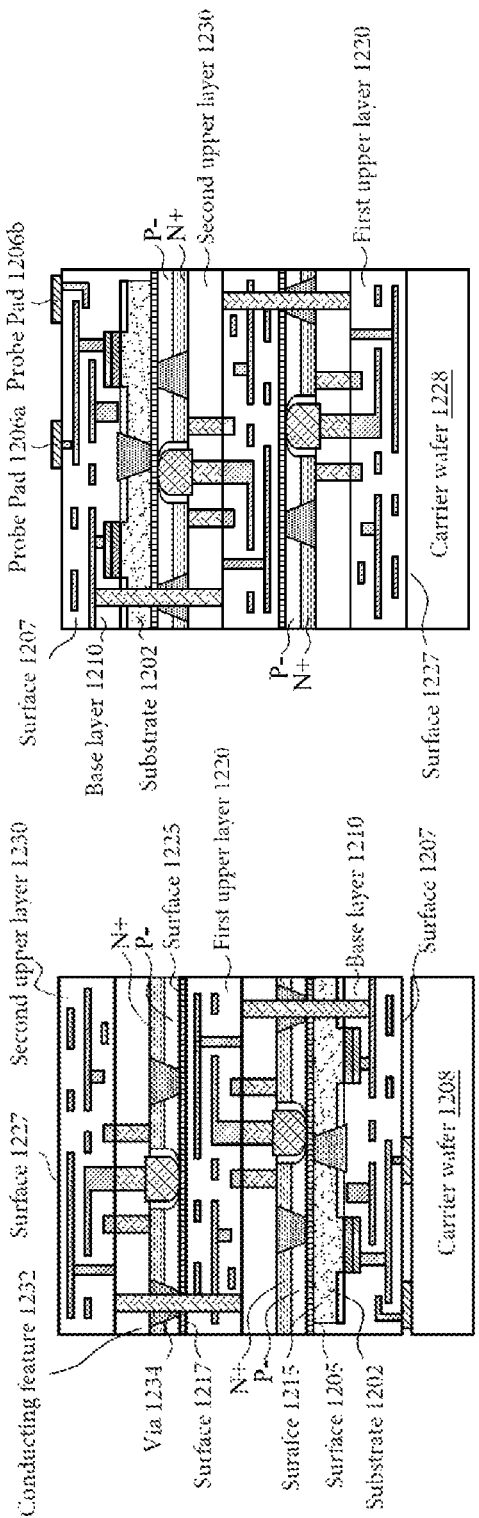

CIRCUIT AND METHOD FOR MONOLITHIC STACKED INTEGRATED CIRCUIT TESTING

The present disclosure is related to the following commonly-assigned U.S. patent application, the entire disclosure of which is incorporated herein by reference: U.S. Ser. No. 14/027,976 entitled "CIRCUIT AND METHOD FOR MONOLITHIC STACKED INTEGRATED CIRCUIT TESTING," filed Sep. 16, 2013, by inventor Sandeep Kumar Goel.

BACKGROUND

Ongoing trends in semiconductor device technology include miniaturization of feature size of semiconductor devices as well as increasing functional complexity of semiconductor devices. Although a feature size reduction may facilitate an increase in the number of semiconductor building blocks per unit area of a semiconductor device, e.g. a die or an integrated circuit (IC), thus facilitating more complex functionality per device, many demands for the increased functional complexity cannot be met by a single device.

Recently, this has led to the development of aggregate devices such as three-dimensional integrated circuits (3D ICs). One example of creating a 3D IC is by building electronic components and their connections in layers on a single semiconductor wafer. As a base layer of the IC is formed on a substrate, a first upper layer is formed over the base layer and is connected to the base layer using vias. Another upper layer may be formed over the first upper layer, and so on. In this way, the IC is sequentially grown layer by layer. An IC thus built is generally known as a monolithic stacked IC.

Though promising in providing density and performance benefits in advanced process nodes, such as 28 nm and below, the method of creating monolithic stacked ICs aforementioned has its own challenges. One of the challenges is directed to manufacture fault testing of monolithic stacked ICs. Conventional IC manufacture fault testing employs a known-good-die (KGD) concept where a pre-fabricated die is tested with a suite of test patterns such as supply open/short test, ground open/short test, stuck-at fault test, current consumption tests (e.g., IDDQ), timing path delay fault (or transition fault) test, etc. If a die is found with defects, it is removed from further processing, such as packaging, to save cost. The manufacture fault testing is typically enabled by some structured test architecture, such as SCAN test architecture. This KGD concept has been found less desirable in monolithic stacked IC manufacture fault testing. This is primarily due to the fact that complete logic generally spans over multiple layers in a monolithic stacked IC and complete fault testing with quality similar to or higher than KGD testing cannot be applied until all or multiple layers are built. Yet, waiting until all or multiple layers are built before applying fault testing presents a significant yield loss issue. In addition, testing of each layer during manufacturing of monolithic stacked ICs enables defect isolation and yield tracking per layer, which can be really helpful in finding layer manufacturing processing related issues.

Accordingly, an enhancement in monolithic stacked IC manufacture fault testing is needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 11a-11i shows an embodiment of monolithic stacked IC manufacture fault test application flow according to various aspects of the present disclosure.

FIGS. 12a-12i shows another embodiment of monolithic stacked IC manufacture fault test application flow according to various aspects of the present disclosure.

DETAILED DESCRIPTION

Figure 1:
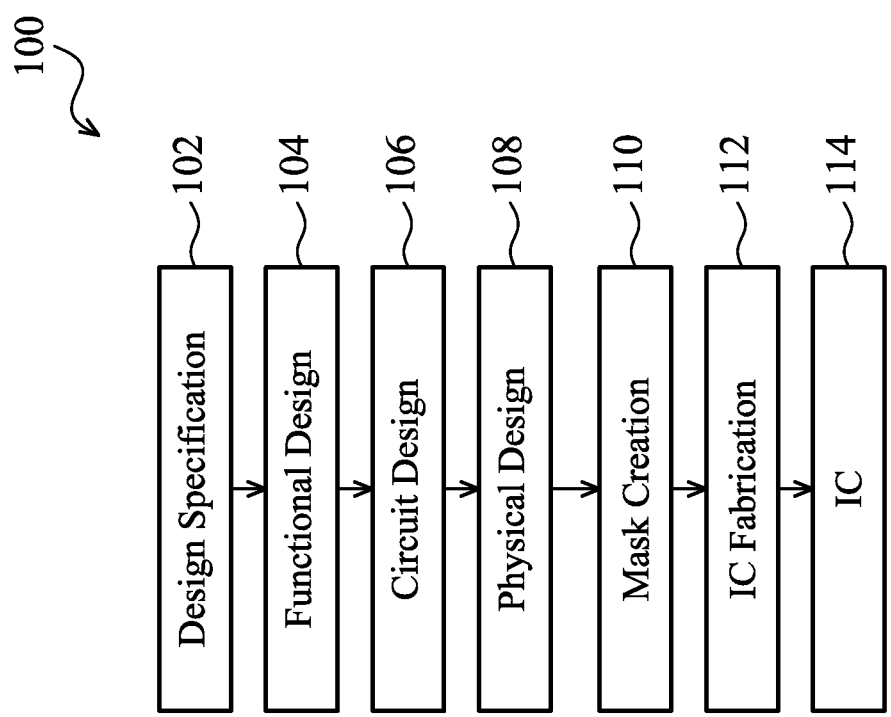
FIG. 1 is a simplified block diagram of an embodiment of an integrated circuit (IC) design and manufacturing flow.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath"

other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure relates generally to fault testing of semiconductor devices, and more particularly, to a layer-by-layer delay fault testing when fabricating monolithic stacked integrated circuits. Specific embodiments are provided as examples to teach the broader inventive concept, and one of ordinary skill in the art can easily apply the teaching of the present disclosure to other methods or apparatus.

FIG. 1 is a simplified block diagram of an embodiment of an integrated circuit (IC) design and manufacturing flow 100 to produce an IC 114. In the present embodiment, the IC 114 is a monolithic stacked IC that includes a base layer and one or more upper layers. The IC design flow 100 typically starts with a design specification 102 which includes the design requirements of the IC 114. It then proceeds to functional design 104 where the design of the IC 114 is partitioned into a plurality of layers and the plurality of layers interact to produce the desired embodiment.

The IC design flow 100 (FIG. 1) proceeds to circuit design 106. In an embodiment, the IC design is described in Register Transfer Level (RTL) language such as Verilog or VHDL and then is synthesized into a netlist. In another embodiment, the IC design is described graphically in schematic. In an embodiment, the IC design includes not only circuits for the intended functionality of the IC 114, but also circuits for uncovering faults (or defects) during IC fabrication 112. This is commonly referred to as Design for Test (DFT) circuits. In general, the faults are the results of semiconductor manufacture process abnormalities, imperfections and process variations. For example, material may be formed where it should not be or material may be absent where it should be. The faults can be modeled at various levels of design abstraction. Two commonly used fault models for detecting opens and shorts are stuck-at-0 (SA0) and stuck-at-1 (SA1) fault models. During fault testing, a fault is detected when a particular test pattern activates or sensitizes the IC 114 to the fault and makes the error observable.

In addition, a concept of timing paths is commonly used in IC circuit design and testing. A timing path in an IC is generally referred to as combinational logic and interconnect between parts of the IC, such as between an input pad and an output pad, between an input pad and a data input of a flip-flop, between a data output of a flip-flop and a data input of another flip-flop, and between a data output of a flip-flop and an output pad. A delay through a timing path is an important parameter of an IC because it often determines how fast the IC can be operated. Moreover, a signal traveling along a timing path in an IC usually must arrive within a timing window for an intended function. If there is too much delay through the timing path, the signal will arrive too late for the intended function. Conversely, if there is too little delay through the timing path, the signal will arrive too early for the intended function. Such out-of-window delay defects are generally referred to as delay faults. Many factors may cause delay faults, one of which is manufacture process variations. For example, manufacture process variations may cause mismatch between expected resistance and capacitance values on gates and interconnects and actual values thereof.

Structured fault testing architecture and automatic test pattern generation (ATPG) are frequently used in DFT. For example, basic scan architecture for an IC typically includes a scan enable input, a scan clock input, and a plurality of scan chains. Each scan chain includes a scan input, a scan output and a plurality of scan flip-flops of the IC in between the scan input and the scan output. The scan enable input controls the IC into one of two test modes: a shift test mode and a capture test mode. In the shift test mode, the plurality of flip-flops in each scan chain forms a chain of serial shift registers. Test pattern data is serially shifted into the scan chain through the scan input at a pace controlled by the scan clock input. At the same time, data in the scan chain is shifted out of and observed at the scan output. In the capture test mode, the plurality of scan flip-flops in each scan chain assumes their respective role in functional mode (non-test mode). When one or more clock signals are applied at the scan clock input, the plurality of scan flip-flops captures results of the test. In a delay fault testing, a plurality of clock signals may be applied at the scan clock input or through an on-chip clock generation circuit, such as a phase locked loop (PLL), that provides clock signals at a desired speed. A first clock signal launches a transition, a "0" to "1" change or an "1" to "0" change, at a start point of a timing path and a second clock signal causes the transition to be captured at an end point of the timing path. In an embodiment, more than one clock signals may be applied for capturing the transition (s). A subsequent shift operation shifts the results out of the scan output and compares the results with predetermined targets to detect whether faults are present in the IC. Various enhancements may be added to the basic scan architecture described above. In an embodiment, test compression logic is added to include more than one scan chains in between one scan input and one scan output thereby to improve test efficiency.

The scan architecture aforementioned works well with a pre-fabricated die, but not with a monolithic stacked IC where complete logic of the IC is not present until all layers of the IC is fabricated. In practice, it is desirable to detect faults as each layer of a monolithic stacked IC is fabricated. For example, if one layer of a monolithic stacked IC is found defective, the IC can be removed from further manufacturing process thereby to save processing and/or manufacturing cost. If removing of the IC is not possible or is not cost-effective, the particular IC/die location can be marked defective and no further testing is performed on that location in future processing and testing steps. This results in test cost savings. This layer-by-layer testing in a monolithic stacked IC fabrication is called known-good-layer (KGL) testing in the present disclosure. Various embodiments of the present disclosure are related to KGL testing and will be described in more details below.

The IC design flow 100 (FIG. 1) proceeds to physical design 108 where an IC design layout is produced. The IC design layout includes various geometrical patterns designed for the IC 114. The geometrical patterns correspond to patterns of metal, oxide, or semiconductor material layers that make up the various components of the IC device 114 to be fabricated. The various material layers combine to form various IC features in each layer of the IC 114.

With the IC design layout, the IC design flow 100 (FIG. 1) proceeds to mask creation 110 to produce one or more masks to be used for fabricating the various layers of the IC product according to the IC design layout. The mask creation 110 includes various tasks such as mask data preparation, where the IC design layout is translated into a form that can be physically written by a mask writer, and mask fabrication, where the design layout prepared by the mask data preparation is modified to comply with a particular mask writer and/or mask manufacturer and is then fabricated.

After the mask (or masks) has been fabricated, the IC design flow 100 (FIG. 1) proceeds to IC fabrication 112. The IC fabrication may be done by a myriad of manufacturing facilities. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business.

In an embodiment, a semiconductor wafer is fabricated using the mask (or masks) to form the IC device 114. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). In the present embodiment, the IC device 114 includes a base layer formed over a substrate and a plurality of upper layers formed over the base layer. The base layer and the plurality of upper layers may be inter-connected using through-layer vias (TLV). As each layer of the IC 114 is fabricated, a KGL testing according to various aspects of the present disclosure is performed to detect faults on the IC 114.

After being fabricated and tested fault free, the IC devices typically go through a packaging and further testing process before being delivered to market.

Figure 2:
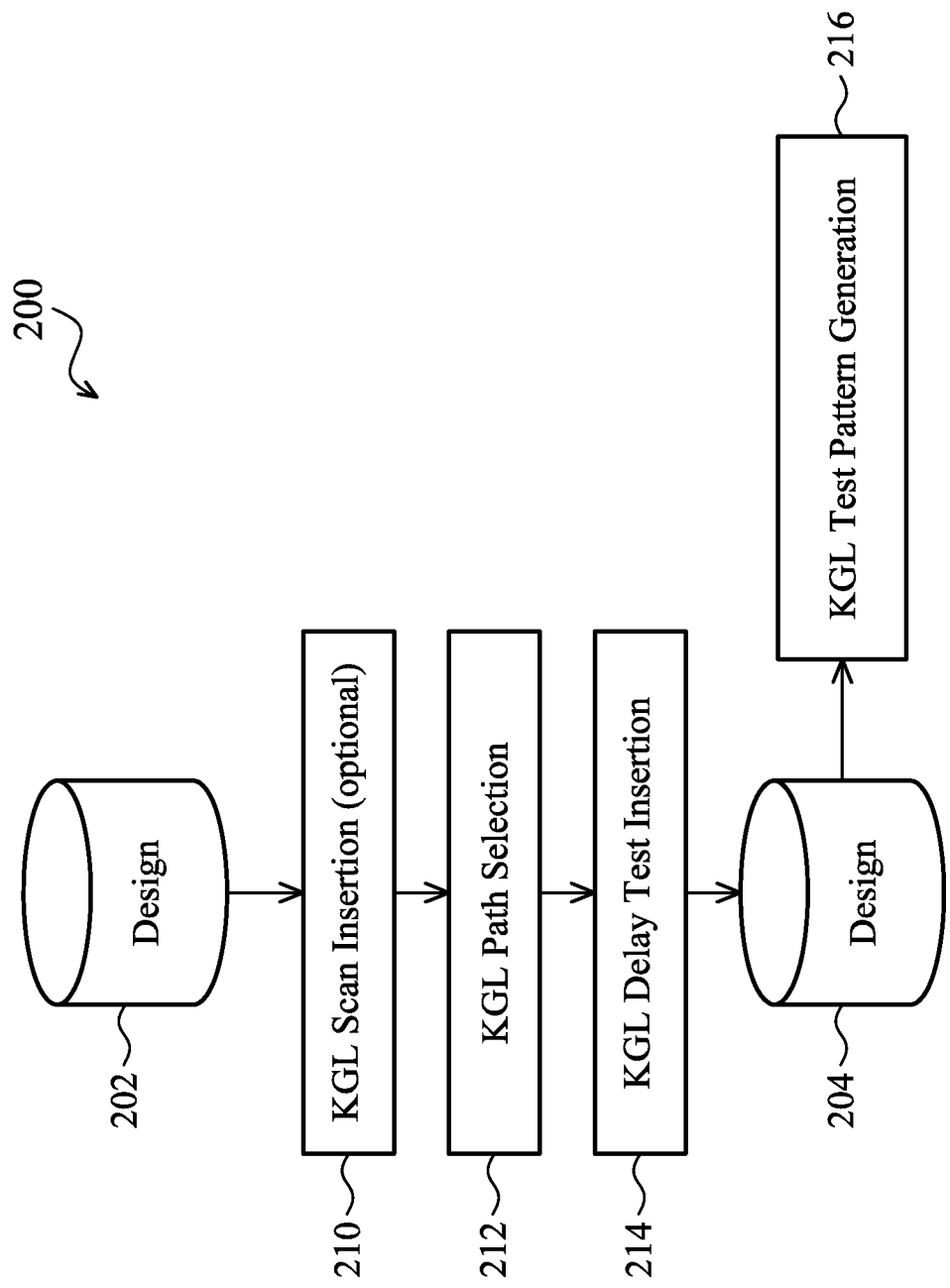
FIG. 2 is an embodiment of a part of the IC circuit design phase shown in FIG. 1 according to various aspects of the present disclosure.

FIG. 2 illustrates an embodiment of a method 200 of KGL test insertion and test pattern generation as part of the circuit design 106 (FIG. 1) according to various aspects of the present disclosure. The KGL test method 200 receives a design 202 where the circuits of the IC 114 have been partitioned into a base layer and a plurality of upper layers with each layer having some combinational logic clouds and/or some functional blocks which may contain sequential logic elements such as flip-flops.

Figure 3:
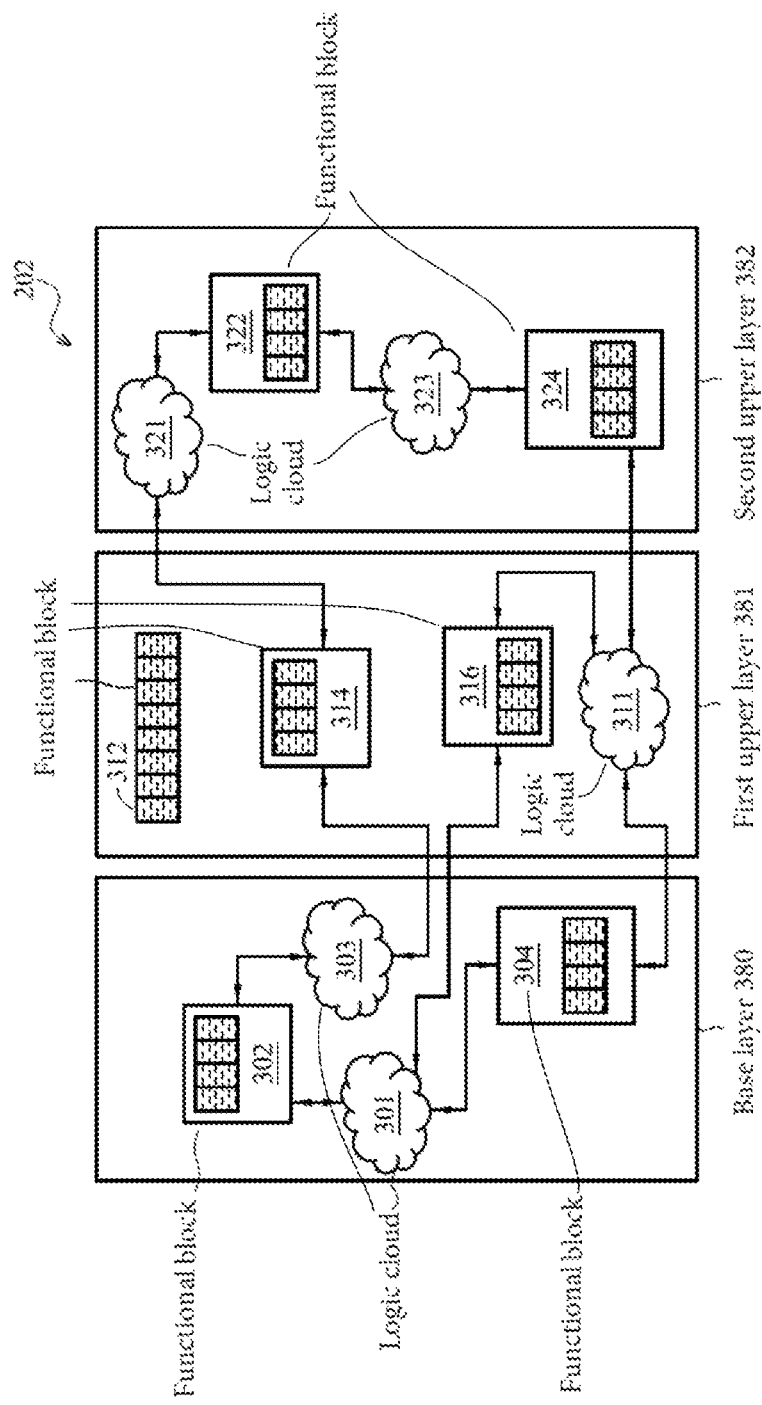
FIG. 3 illustrates a simplified graphical representation of an embodiment of a monolithic stacked IC design.

One example of the design 202 is shown in FIG. 3. As illustrated in FIG. 3, the design 202 includes a base layer 380, a first upper layer 381 and a second upper layer 382. The base layer 380 includes two functional blocks, 302 and 304, and two logic clouds, 301 and 303. The first upper layer 381 includes three functional blocks, 312, 314 and 316, and one logic cloud 311. The second upper layer 382 includes two functional blocks, 322 and 324, and two logic clouds, 321 and 323. There may be interconnects between one layer and another layer. In an embodiment, some functional blocks contain scan flip-flops which may have already been stitched into one or more serial shift registers for scan test purposes which are called scan segments. For the following discussion, a pre-stitched scan segment is treated the same way as a scan flip-flop without limiting the present disclosure. In an embodiment, a scan flip-flop is register based. In another embodiment, a scan flip-flop is latch based.

The KGL test method 200 (FIG. 2) proceeds to an optional operation 210 to insert KGL scan chains. Methods and circuits for KGL scan architecture are fully disclosed in the previously cited and commonly-assigned U.S. patent application Ser. No. 14/027,976 entitled "CIRCUIT AND METHOD FOR MONOLITHIC STACKED INTEGRATED CIRCUIT TESTING." For simplicity purposes, they are omitted in the present disclosure. Those of ordinary skill in the art should appreciate that the present disclosure functions with or without KGL scan circuits.

Figure 4A:
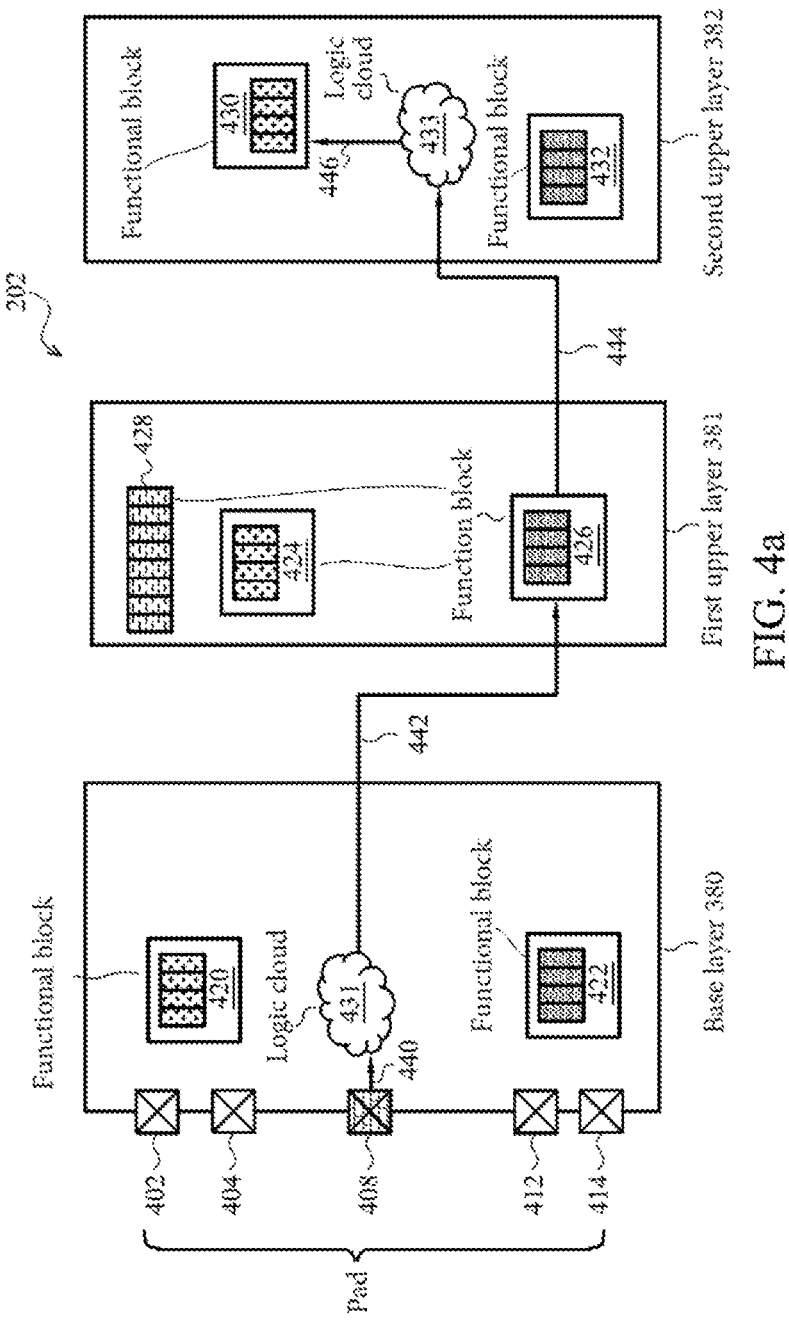
FIGS. 4a-4c illustrate a path delay test architecture in a monolithic stacked IC design according to various aspects of the present disclosure.

The KGL test method 200 (FIG. 2) proceeds to operation 212 to select timing paths for delay fault testing. If a timing path resides completely within one layer in the IC 114, then testing of the timing path can be accomplished with the KGL scan architecture with or without the present disclosure. In the present embodiment, timing paths are selected among those that span over two or more layers of the IC 114. The selected timing paths are herein referred to as critical paths. One exemplar critical path is shown in FIG. 4a as from an input pad 408 in the base layer 380 to a functional block 430 in the second upper layer 382 of the IC 114. For simplicity purposes, this critical path is denoted as 408/430 in the following discussion. As illustrated in FIG. 4a, the critical path 408/430 includes the input pad 408; two logic clouds, 431 and 433; two functional blocks, 426 and 430; and nodes 440, 442, 444 and 446 coupling the input pad, the logic clouds and the functional blocks. Critical paths, such as 408/430, pose particular issues in a monolithic stacked IC fabrication because complete timing paths are not present until all or multiple layers are formed. For example, when the base layer 380 is formed on a substrate and before the upper layers, 381 and 382, are formed, testing path delay through the logic cloud 431 may be critical in detecting delay faults in the base layer 380 and/or in monitoring manufacture process variations. In addition, since overall system performance may be directly or indirectly related to the one or more inter-layer critical paths, testing of critical paths is very important.

Figure 4B:
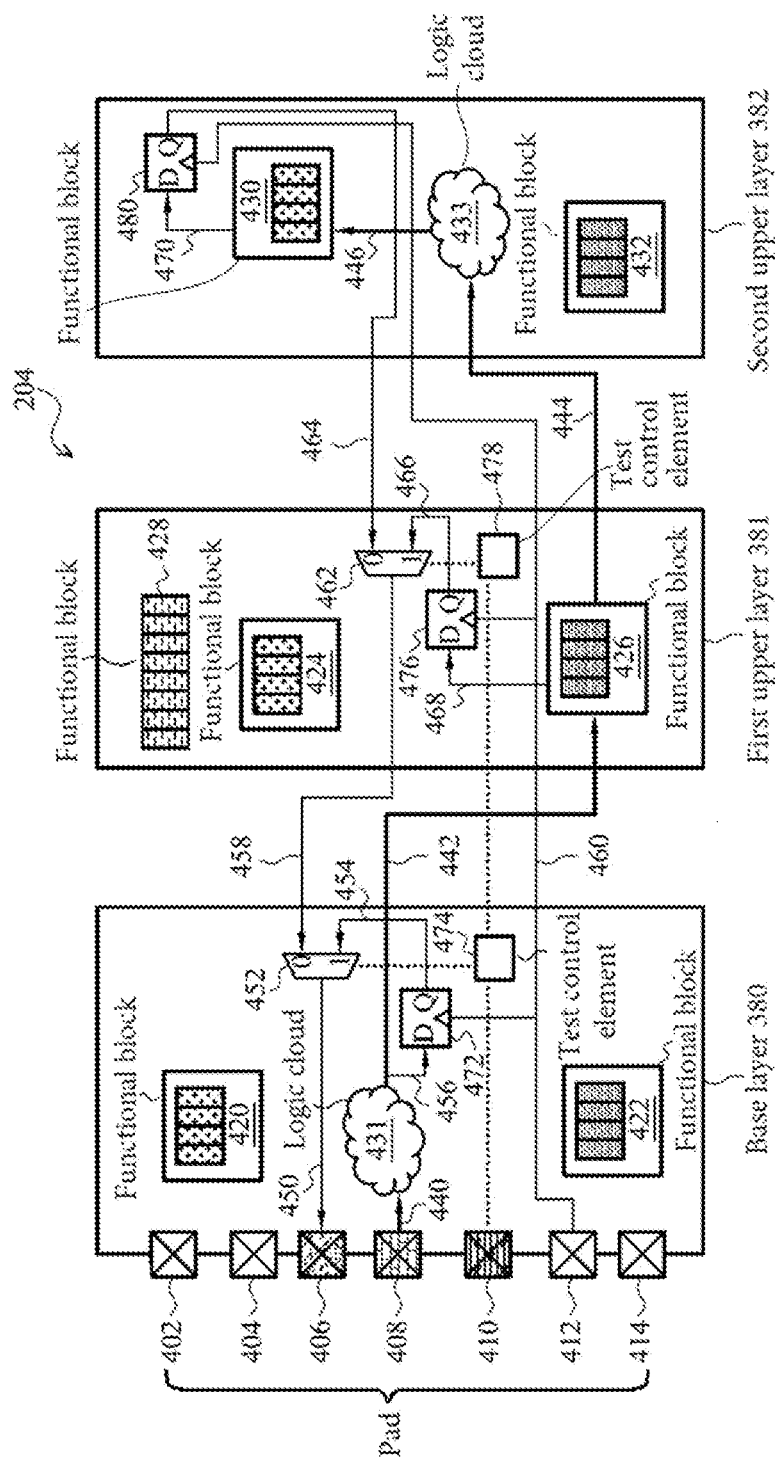

The KGL test method 200 (FIG. 2) proceeds to operation 214 to insert test circuits for delay fault testing. Referring to FIG. 4b, in the present embodiment, the KGL test circuits include a test control input 410; a test clock input 412; a test output 406; a plurality of test control elements, 474 and 478; a plurality of test flip-flops, 472, 476 and 480; a plurality of multiplexers, 452 and 462; and a plurality of nodes coupling the test inputs, the test output, the test control elements, the test flip-flops, and the multiplexers.

The test clock input 412 is coupled to clock inputs of the test flip-flops, 472, 476 and 480, for capturing and/or launching transitions through the critical path 408/430. In an embodiment, the test clock input 412 is an input/output (10) pad at the base layer 380. In another embodiment, the test clock input 412 is a signal from an on-chip clock generation circuit, such as a PLL, residing at the base layer. In another embodiment, the test clock input 412 may be shared with other on-chip functional clocks.

Data inputs (D pins) of the test flip-flops, 472, 476 and 480, are coupled to the critical path 408/430. Data outputs (Q pins) of the test flip-flops, 472, 476 and 480, are coupled to data inputs of the multiplexers. Specifically, at the base layer 380, the data input of the test flip-flop 472 is coupled to an output of the logic cloud 431 via node 456 and the data output of the test flip-flop 472 is coupled to a data input of the multiplexer 452 via node 454. In the present embodiment, the test flip-flop 472 is inserted by operation 214 (FIG. 2) to test delay of the critical path 408/430 through the base layer 380. At the first upper layer 381, the data input of the test flip-flop 476 is coupled to the functional block 426 via node 468 and the data output of the test flip-flop 476 is coupled to a data input of the multiplexer 462 via node 466.

In an embodiment, the test flip-flop 476 is inserted by operation 214 (FIG. 2) to test delay of the critical path 408/430 through the base layer 380 and the first upper layer 381. In another embodiment, the test flip-flop 476 is an existing flip-flop in the functional block 426 that is an end point of the critical path 408/430. At the second upper layer 382, the data input of the test flip-flop 480 is coupled to the functional block 430 via node 470 and the data output of the test flip-flop 480 is coupled to another data input of the multiplexer 462 via node 464. In an embodiment, the test flip-flop 480 is inserted by operation 214 (FIG. 2) to test delay of the critical path 408/430 through the base layer 380, the first upper layer 381 and the second upper layer 382. In another embodiment, the test flip-flop 480 is an existing flip-flop in the functional block 430 that is an end point of the critical path 408/430.

The test output 406 is coupled to an output of the multiplexer 452 via node 450 for observing the outputs of the test flip-flops. In an embodiment, the test output 406 shares the same output pad as a scan output of a KGL scan circuits. The test control elements, 474 and 478, configure the multiplexers, 452 and 462, such that path delay testing of the IC 114 (design 204) may be conducted layer-by-layer. For example, the multiplexer 452 may be configured to pass the data output of the test flip-flop 472 to the test output 406 thereby a delay through the base layer 380 may be tested with the first upper layer 381. This point will be illustrated in more details in a later section of the present disclosure. Moreover, operation 214 (FIG. 2) does not insert test control elements and multiplexers in the second upper layers 382. That is because the second upper layer 382 is the topmost layer in the design 204 and the data output of the test flip-flop 480 is not multiplexed with another signal. From another viewpoint, the second upper layer 382 may be thought to have a control element and a multiplexer inserted but subsequently optimized out (degenerated). In addition, in the present embodiment as shown in FIG. 4b, the test control elements, 474 and 478, are implemented as a chain of serial shift registers controlled through IO pad 410. In another embodiment, the test control elements, 474 and 478, are implemented as IO pads at the base layer 380. In yet another embodiment, the test control elements, 474 and 478, are implemented in the base layer 380 as storage elements, such as registers, programmed through a programmable interface, such as an IEEE1149.1 interface or an IEEE1500 interface. In another embodiment, an output of the test control element 478 may be fed back to the base layer 380 and may be connected to another IO Pad. This may be used for monitoring values of the test control elements 474 and 478.

Figure 4C:
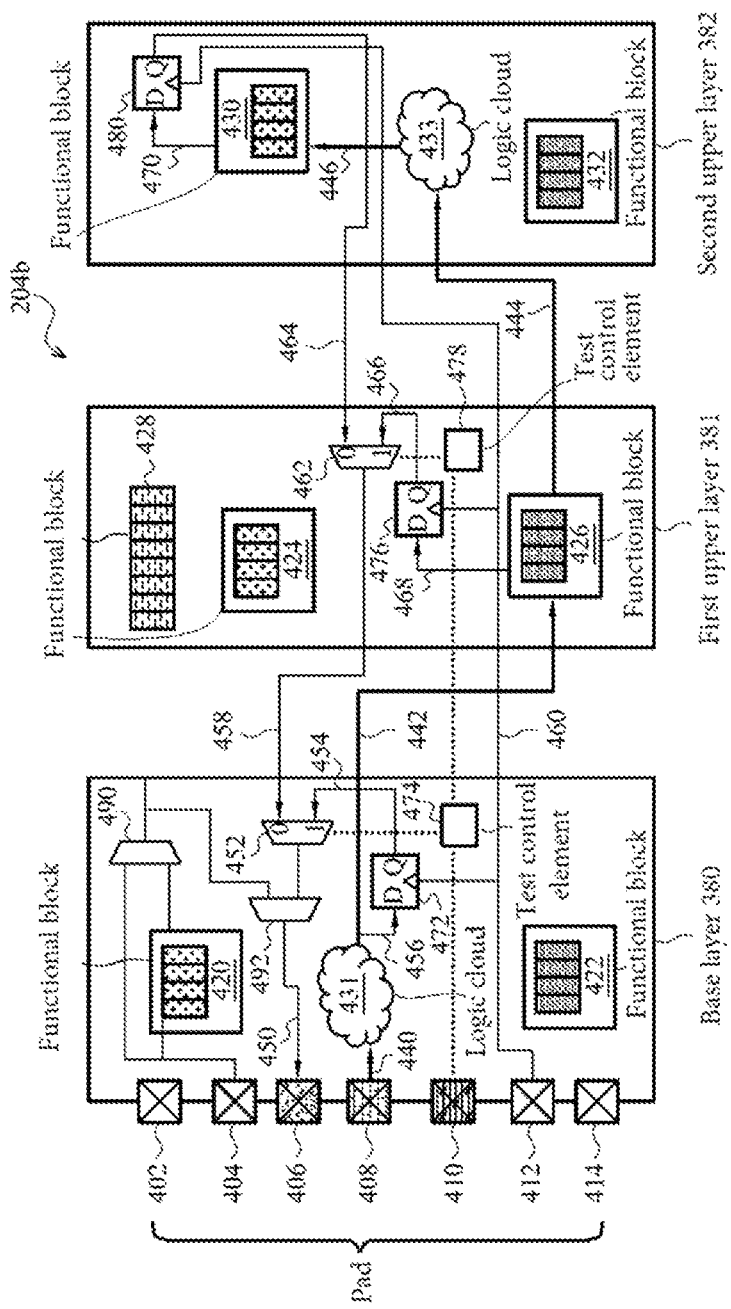

The aforementioned KGL path delay test circuits are compatible with KGL scan architecture described in the previously cited and commonly-assigned U.S. patent application Ser. No. 14/027,976 entitled "CIRCUIT AND METHOD FOR MONOLITHIC STACKED INTEGRATED CIRCUIT TESTING." FIG. 4c shows a design 204b including the KGL path delay test circuits and KGL scan circuits. For simplicity purposes, only partial KGL scan circuits are shown at the base layer 380. As shown in FIG. 4c, multiplexers 490 and 492 are inserted by the operation 210 (FIG. 2) and the test output 406 is shared between the KGL path delay test circuits and the KGL scan circuits. For simplicity purposes, following discussions are made with reference to the design 204 shown in FIG. 4b. Those of ordinary skill in the art should appreciate that the present disclosure functions with or without KGL scan circuits.

Figure 5:
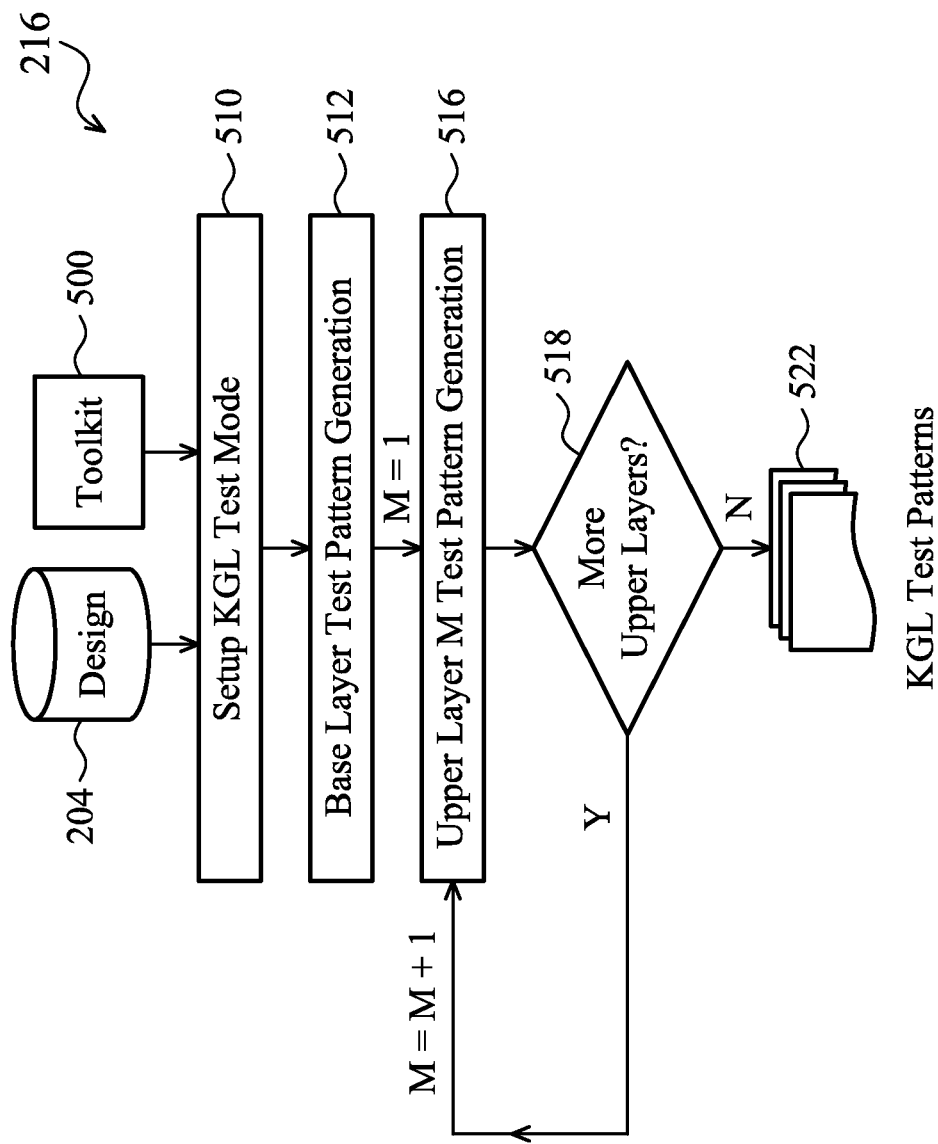
FIG. 5 illustrates a monolithic stacked IC test pattern generation flow according to various aspects of the present disclosure.

After having produced the design 204, the KGL test method 200 (FIG. 2) proceeds to operation 216 where KGL path delay test patterns are generated. The KGL path delay test patterns are generated on a layer-by-layer basis which is illustrated in FIG. 5 in conjunction with FIGS. 6a-9. In another embodiment, KGL path delay test patterns may be generated to include two or more layers simultaneously.

Referring to FIG. 5, an embodiment of KGL path delay test pattern generation flow 216 begins with operation 510 where the design 204 is set into a test mode suitable for path delay testing. In an embodiment, operation 510 includes setting up the design 204 into test mode through IO pads. In another embodiment, operation 510 includes setting up the design 204 into test mode through a programmable interface, such as an IEEE 1149.1 interface or an IEEE 1500 interface.

Figure 6A:
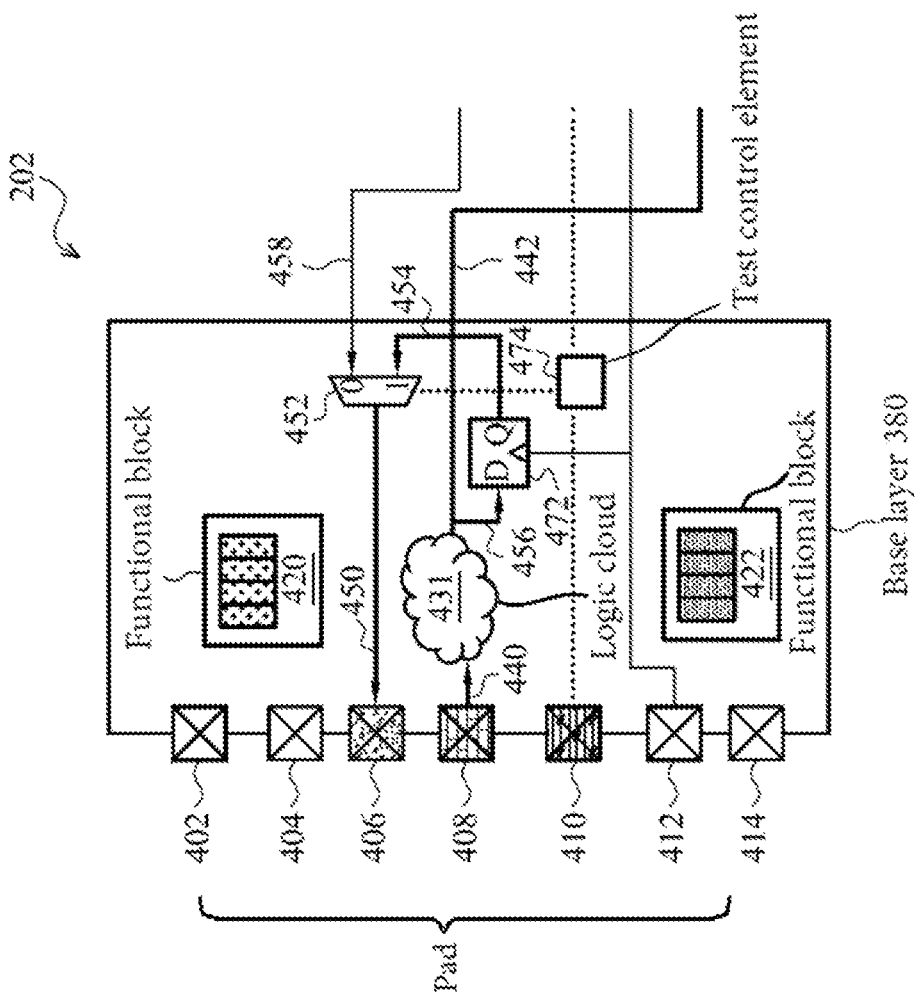
FIGS. 6a-9 illustrate a monolithic stacked IC configurations during a layer-by-layer test pattern generation flow according to various aspects of the present disclosure.

The KGL path delay test pattern generation flow 216 (FIG. 5) proceeds to operation 512 where test patterns for the base layer 380 are generated. Referring to FIG. 6a, the test control element 474 is set to a value "1." With this configuration, the data output (Q pin) of the test flip-flop 472 is observed at the test output 406 via the node 454, the multiplexer 452 and the node 450. Signal transitions are applied at the input pad 408 and captured at the test flip-flop 472 thereby a delay of the critical path 408/430 through the base layer 380 may be tested.

Figure 6B:
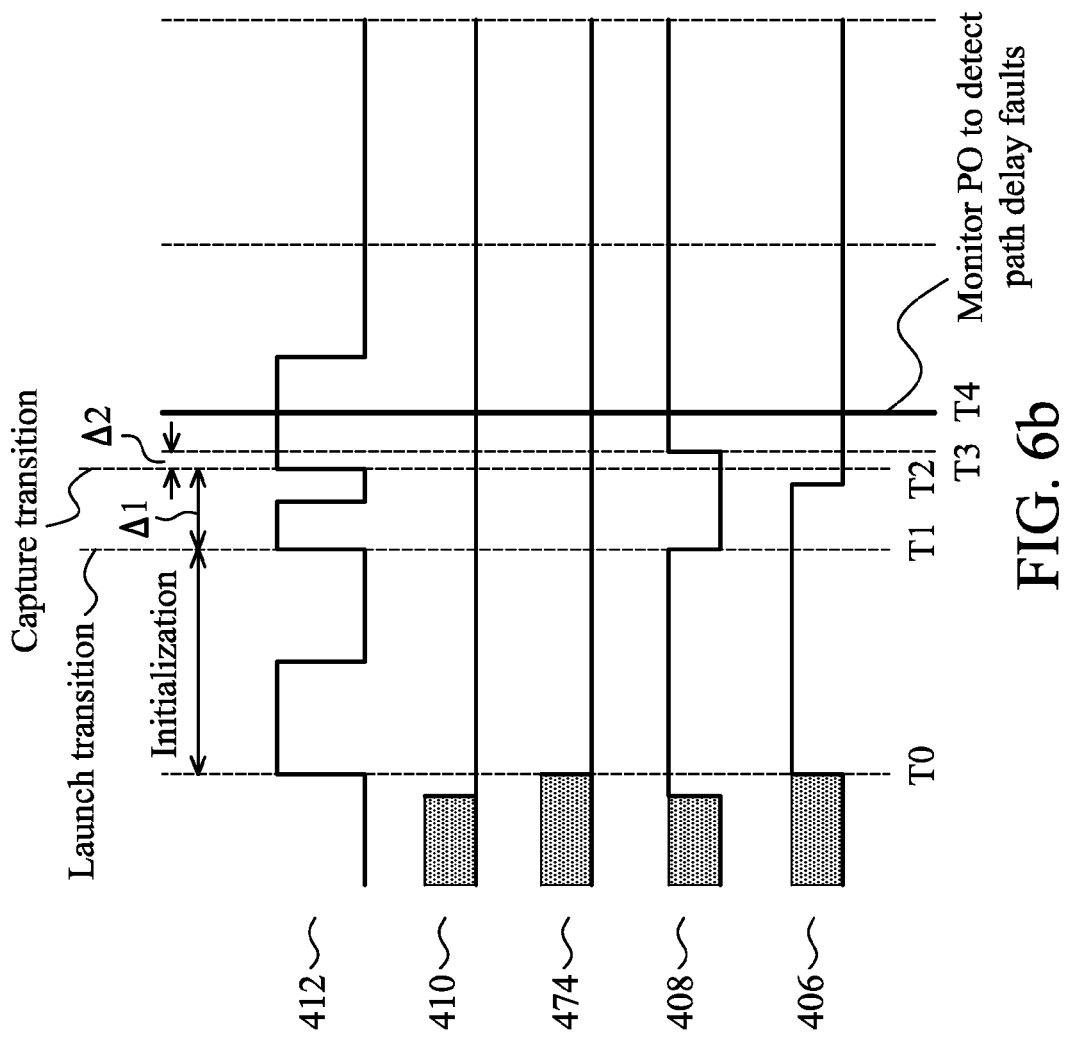

FIG. 6b shows an exemplar timing diagram of the path delay testing with the base layer 380. As shown in FIG. 6b, an initialization period starts at time T0. During the initialization period, input signals of the logic cloud 431, such as input pad 408, are supplied with constant logic values. The initialization period is long enough so that the input signals propagate through the logic cloud 431 and reach the data input (D pin) of the test flip-flop 472 for proper capture. At time T1, a clock pulse (a rising edge in the present embodiment) is launched at the test clock input 412 which causes the test flip-flop 472 to capture a first current value (logic "1" in the present embodiment) at its D pin. At about the same time, a signal transition is launched at the input pad 408 (a "1" to "0" transition in the present embodiment). The signal transition has such effect that, after a computation of the logic cloud 431 and a delay thereof, the D pin of the test flip-flop 472 is to transition from the first current value (logic "1") to an opposite value (logic "0").

Referring again to FIG. 6b, at time T2, another clock pulse is launched at the test clock input 412 which causes the test flip-flop 472 to capture a second current value at its D pin. Let $\Delta1$ denote delay between T2 and T1 ($\Delta1=T2-T1$). The time T2 is selected based on an expected delay through the logic cloud 431 and the nodes 440 and 456. In an embodiment, the time T2 is selected such that $\Delta1$ is slightly greater than a maximum value of the expected delay and the second current value captured by the test flip-flop 472 is logic "0." When the base layer 380 is fabricated and subject to the KGL path delay test, if an actual delay through the logic cloud 431 and the nodes 440 and 456 is smaller than $\Delta1$, then the second current value captured by the test flip-flop 472 will be logic "0." On the other hand, if an actual delay through the logic cloud 431 and the nodes 440 and 456 is greater than $\Delta1$, then the second current value captured by the test flip-flop 472 will be logic "1." Thus, by observing the second current value of the test flip-flop 472 at the test output 406, a delay fault ("too much delay") through logic cloud 431 can be detected. In another embodiment, the time T2 is selected such that $\Delta1$ is slightly smaller than a minimum value of the expected delay and the second current value captured by the test flip-flop 472 remains logic "1."

When the base layer 380 is fabricated and subject to the KGL path delay test, if an actual delay through the logic cloud 431 and the nodes 440 and 456 is greater than Δ1, then the second current value captured by the test flip-flop 472 will be logic "1." On the other hand, if an actual delay through the logic cloud 431 and the nodes 440 and 456 is smaller than Δ1, then the second current value captured by the test flip-flop 472 will be logic "0." Thus, by observing the second current value of the test flip-flop 472 at the test output 406, a delay fault ("too little delay") through logic cloud 431 can be detected.

Referring again to FIG. 6b, at time T3, the input pad 408 transitions from "0" to "1" in preparation for further path delay test pattern generation. The time T3 is selected such that a delay from T2 to T3 (Δ2=T2−T1) is sufficient for the test flip-flop 472 to hold its captured value for observation. At time T4, the test output 406 is monitored to detect delay faults as aforementioned.

The test patterns for detecting delay faults at the base layer 380 are generated by a toolkit 500, such as a commercially available ATPG tool. The test patterns include a sequence of signal transitions, such as shown in FIG. 6b. The upper layers 381 and 382 are ignored during operation 512 (FIG. 5) because they may not even exist when the base layer 380 is being tested during fabrication of the IC device 114 (design 204).

Figure 7:
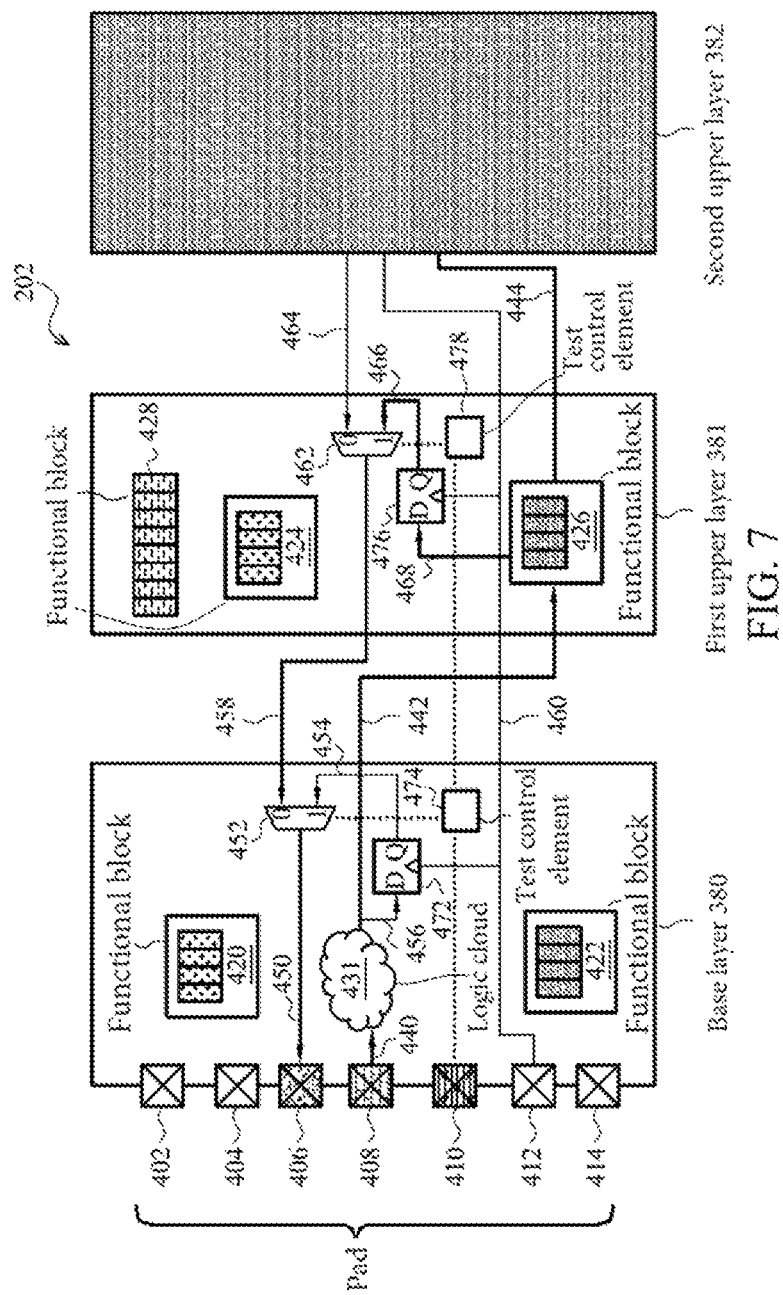

The KGL test pattern generation flow 216 (FIG. 5) proceeds to operation 516 to generate test patterns for the first upper layer 381. Referring to FIG. 7, the test control elements, 474 and 478, are set to a value "0" and a value "1" respectively. With this configuration, the data output (Q pin) of the test flip-flop 476 is observed at the test output 406 via the node 466, the multiplexer 462, the node 458, the multiplexer 452 and the node 450. Signal transitions are applied at the input pad 408 and captured at the test flip-flop 476 thereby a delay of the critical path 408/430 through the base layer 380 and the first upper layer 381 may be tested.

Figure 8:
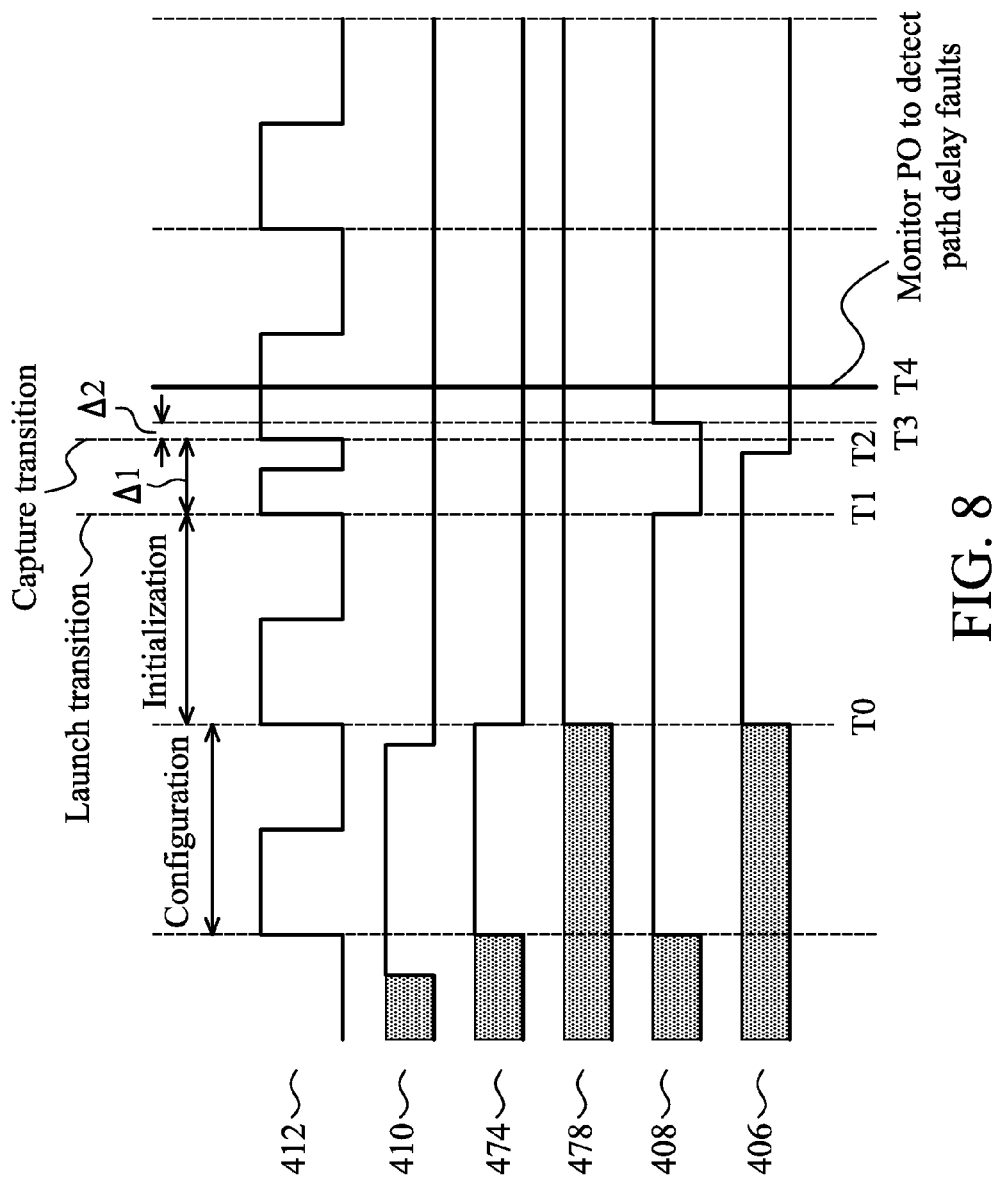

FIG. 8 shows an exemplar timing diagram of the path delay testing with the base layer 380 and the first upper layer 381. As shown in FIG. 8, at time T0, the design 204 is properly configured for path delay testing with the test control elements, 474 and 478, being set to a value "0" and a value "1" respectively through the test control input 410. Starting at time T0, a sequence of signal transitions are generated and applied at the test clock input 412 and the input pad 408 at time T1, T2 and T3. At time T4, the test output 406 is monitored to detect delay faults of the critical path 408/430 through the base layer 380 and the first upper layer 381. The details of this operation are similar to the discussion aforementioned with reference to FIG. 6c and are thus omitted for simplicity purposes. The toolkit 500 is again executed to generate test patterns for detecting delay faults with the design 204 thus configured (FIG. 7).

The KGL test pattern generation flow 216 (FIG. 5) proceeds to operation 518. If there is no more upper layer for fault testing, the KGL test generation flow 216 terminates and stores test patterns thus far generated into a data file 522. If there are more upper layers for fault testing, as is the case in the present embodiment, the KGL test pattern generation flow 216 goes back to operation 516 to test the second upper layer 382.

Figure 9:
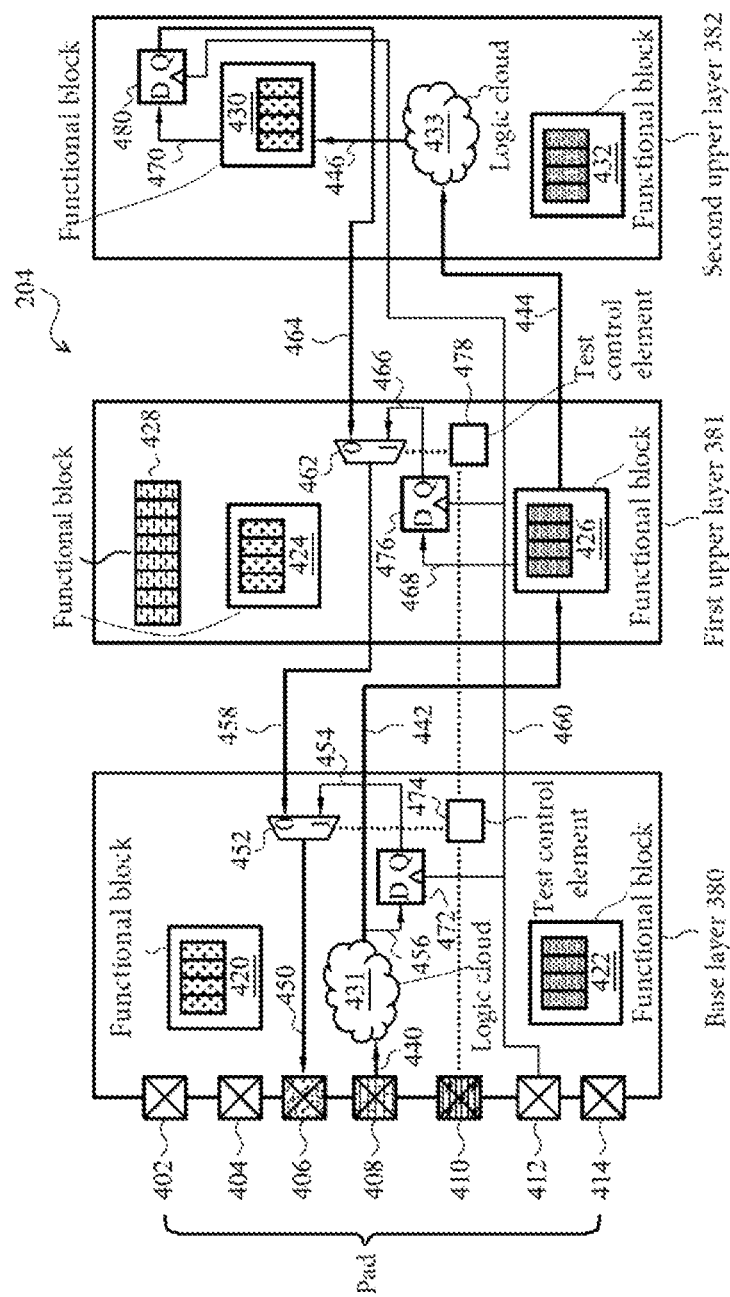

Referring to FIG. 9, operation 516 sets the test control elements, 474 and 478, to a value "0" and a value "0" respectively. With this configuration, the data output (Q pin) of the test flip-flop 480 is observed at the test output 406 via the node 464, the multiplexer 462, the node 458, the multiplexer 452 and the node 450. Signal transitions are applied at the input pad 408 and captured at the test flip-flop 480 thereby a delay of the critical path 408/430 through the base layer 380, the first upper layer 381 and the second upper layer 382 may be tested. The toolkit 500 is again executed to generate test patterns for detecting delay faults with the design 204 thus configured (FIG. 9).

In the present embodiment, the test flip-flops, 472, 476 and 480, only serve as observing point of the KGL test circuits. In another embodiment, the test flip-flops, 472, 476 and/or 480, may be properly multiplexed into the critical path 408/430 to launch signal transitions, thus serving as both observing and controlling points of the KGL test circuits. In the present embodiment, critical paths are defined based on a monolithic stacked IC. However, in another embodiment, critical paths per layer that may or may not be different from the monolithic stacked IC critical path may be selected for testing.

Thus far illustrated is a layer-by-layer KGL path delay test pattern generation flow for the monolithic stacked IC 114 at circuit design phase 106 (FIG. 1). In another embodiment, with appropriate test control settings, test patterns of concurrent delay fault testing of two or more layers in the monolithic stacked IC 114 can be generated. Furthermore, in another embodiment, delay fault test patterns for the entire monolithic stacked IC 114 may be generated. In yet another embodiment, other combinations of layers testing can be generated. When the monolithic stacked IC 114 is fabricated at phase 112 (FIG. 1), the test patterns are applied, as each layer is fabricated, for detecting manufacture faults of the IC 114 and/or for monitoring manufacture process variations. This is illustrated in FIG. 10 in conjunction with FIGS. 11a-11i and FIGS. 12a-12i.

Figure 10:
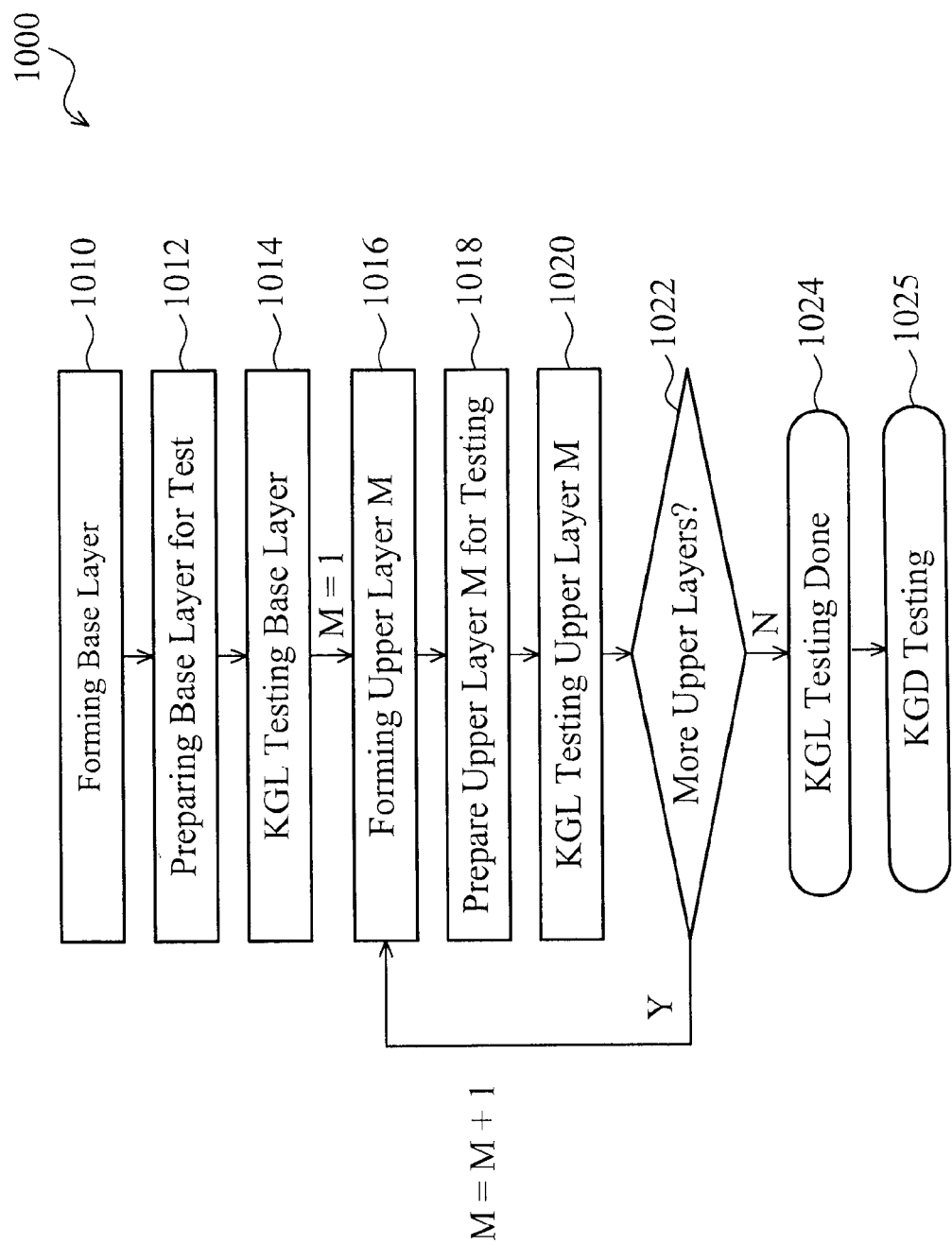
FIG. 10 illustrates a monolithic stacked IC manufacture fault testing flow according to various aspects of the present disclosure.

Referring to FIG. 10, an embodiment of a monolithic stacked IC manufacture fault testing flow 1000 is shown. The testing flow 1000 begins with operation 1010 where a wafer is processed to include a base layer. FIG. 11a shows one exemplar base layer 1110 for the IC 114. The base layer 1110 includes a substrate 1102. The base layer is defined to have two surfaces 1105 and 1107. In the present embodiment, the surface 1105 is at an active region side of the base layer and the surface 1107 is at a metal side of the base layer. In an embodiment, the substrate 1102 is a silicon substrate. The base layer 1110 further includes a via 1104. In the present embodiment, the via 1104 is a through-silicon via (TSV).

After receiving the base layer 1110, the testing flow 1000 (FIG. 10) proceeds to operation 1012 for preparing the base layer 1110 for fault testing. Referring to FIG. 11b, a probe pad 1106 is attached to the surface 1105 and electrically contacts the base layer 1110 through the via 1104. Other probe pads suitable for fault testing of the base layer 1110 are similarly attached. Next, as illustrated in FIG. 11c, the base layer 1110 is bonded to a carrier wafer 1108 with the surface 1107 facing the carrier wafer. The probe pads, such as the probe pad 1106, are exposed. Thus bonded, as shown in FIG. 11d, the base layer 1110 is ready for fault testing.

The testing flow 1000 (FIG. 10) proceeds to operation 1014 for applying test patterns to the base layer. The test patterns have been generated according to one or more embodiments of the KGL test pattern generation flow 216 as shown in FIG. 5 with test configurations such as shown in FIG. 6a. If defects are found with the base layer 1110, some dispositions may be taken. For example, the IC 114 may be marked bad on a wafer map and discarded for further fabrication and processes. For example, the base layer 1110 may be repaired to fix the defects. In addition, a delay value measured with the base layer 1110 may be used for monitoring manufacture process variations.

Once the base layer 1110 is found to be satisfactory for further IC fabrication, the testing flow 1000 (FIG. 10) proceeds to operation 1016 for forming an upper layer over the base layer. This is illustrated in FIGS. 11e-11g. FIG. 11e shows that the carrier wafer 1108 is detached from the base layer 1110. FIG. 11f shows that the base layer 1110 is bonded on the carrier wafer 1108 with the surface 1105 facing the carrier wafer 1108. FIG. 11g shows that an upper layer 1120 is formed over the surface 1107 and electrically contacts the base layer 1110. In the present embodiment, as shown in FIG. 11g, the upper layer 1120 has two surfaces 1115 (active region side) and 1117 (metal region side), with the surface 1115 directly over the surface 1107. Forming the upper layer 1120 may be done by a variety of processes. In an embodiment, a process of forming the upper layer 1120 starts with receiving a new wafer (a donor wafer), constructing dopant regions in a top layer of the new wafer and activating the dopant regions at a high temperature, such as about 1000 degree Celsius. The process then proceeds to implanting hydrogen into the dopant regions for cutting the dopant regions at a later step, bonding the new wafer to the base layer 1110 with the dopant regions directly over the base layer 1110 and performing an ion cut process to the new wafer thereby leaving a thin layer of dopant regions over the base layer 1110. The process then proceeds to forming shallow trench isolations (STI) in the thin layer of dopant regions for defining isolation regions for through-layer vias and for defining active regions for devices, such as recess channel array transistors (RCATs). In an embodiment, forming STI regions includes etching shallow trenches in the dopant regions, depositing a dielectric material layer, such as oxide, into the shallow trenches and over the dopant regions and performing a chemical-mechanical polishing (CMP) process to the dielectric material layer. The process of forming the upper layer 1120 then proceeds to etching gate regions within the active regions defined by the STI regions, forming gate oxide and forming gate electrode. The process further includes forming interconnect structures within the upper layer 1120 as well as between the upper layer 1120 and the base layer 1110. In an embodiment, a process of forming interconnect structures includes forming a dielectric material layer over the STI and active regions of the upper layer 1120, performing a CMP process to the dielectric material layer, etching the dielectric material layer and/or the STI regions to form through-layer vias and/or RCAT contact trenches, depositing conducting materials, such as copper, into the vias and/or trenches and performing another CMP process to the conducting materials.

With the upper layer 1120 thus formed directly over the base layer 1110, The testing flow 1000 (FIG. 10) proceeds to operation 1018 for preparing the base layer 1110 and the upper layer 1120 for fault testing. This is illustrated in FIGS. 11h and 11i. FIG. 11h shows that the carrier wafer 1108 is detached from the base layer 1110. FIG. 11i shows that the upper layer 1120 is bonded onto the carrier wafer 1108 with the surface 1117 facing the carrier wafer 1108. With such bonding, the probe pads attached to the surface 1105, such as the probe pad 1106, are exposed for applying tests to the base layer 1110 and the upper layer 1120.

The testing flow 1000 (FIG. 10) proceeds to operation 1020 for applying test patterns to the base layer 1110 and the upper layer 1120. The test patterns have been generated according to one or more embodiments of the KGL test pattern generation flow 216 as shown in FIG. 5 with test configurations such as shown in FIG. 7. If defects are found with the layers, some dispositions may be taken. For example, the IC 114 may be marked bad on the wafer map and discarded for further fabrication and processes. For example, the upper layer 1120 may be repaired to fix the defects. In addition, a delay value measured with the upper layer 1120 may be used for monitoring manufacture process variations. Moreover, the delay value measured with the upper layer 1120 may be compared with the delay value measured with the base layer 1110 for monitoring manufacture process variations.

The testing flow 1000 (FIG. 10) proceeds to operation 1022. If there is no more upper layer to fabricate, the KGL testing flow finishes at operation 1024 and further testing to the completed stacked IC 114 may be performed in operation 1025. For example, a known-good-die (KGD) testing of the IC 114 may be performed to gain higher test coverage as all layers and all connections of the IC 114 are now complete. For example, the IC 114 may be cut out of the wafer, packaged, and tested again with the package.

If there are more upper layers to be fabricated and tested, the testing flow 1000 (FIG. 10) goes back to operation 1016 and the aforementioned process of forming and testing an upper layer of the IC 114 is repeated.

FIGS. 12a-12i illustrate another embodiment of the testing flow 1000 (FIG. 10) according to various aspects of the present disclosure. For simplicity purposes, only brief descriptions of the drawing are made with specific features highlighted.

Figure 12A:
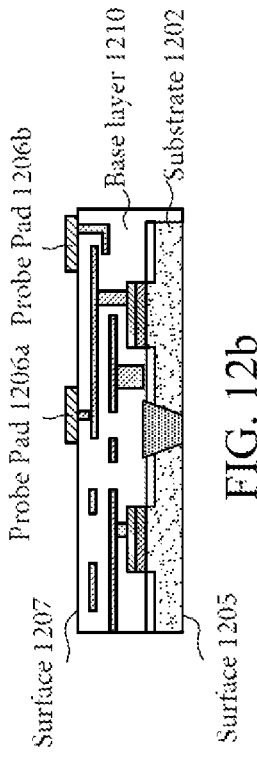
Figure 12B:
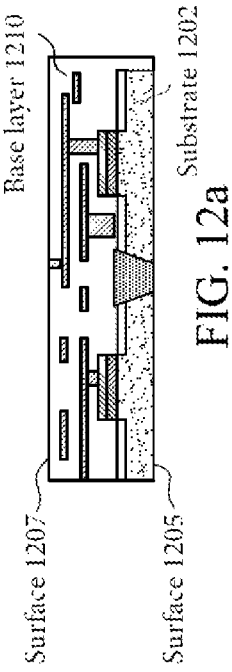

FIG. 12a shows an exemplar base layer 1210 of the IC 114 with a substrate 1202 and two surfaces 1205 (active region side) and 1207 (metal side). FIG. 12b shows that probe pads 1206a and 1206b are attached to the surface 1207 and electrically contact the base layer 1210. Test patterns for the base layer 1210 are applied for testing the base layer 1210 pursuant to operation 1014 (FIG. 10).

Figure 12C:
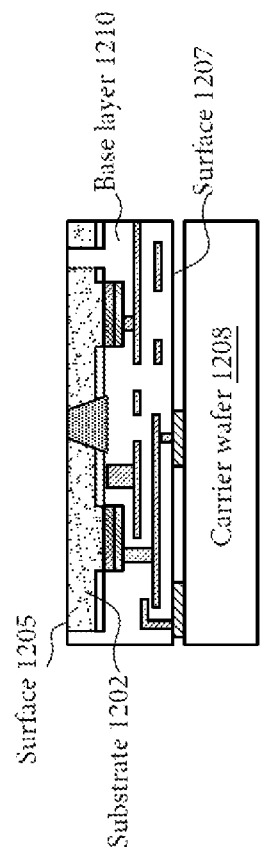

FIG. 12c shows that the base layer 1210 is bonded to a carrier wafer 1208 with the surface 1207 facing the carrier wafer 1208. In an embodiment, the probe pads 1206a and 1206b are removed (or detached) from the base layer 1210 before the base layer 1210 is bonded to the carrier wafer 1208. In another embodiment, the probe pads 1206a and 1206b remain on the surface 1207 when the base layer 1210 is bonded to the carrier wafer 1208. FIG. 12d shows that a first upper layer 1220 is formed over the base layer 1210. The first upper layer 1220 has two surfaces, 1215 (active region side) and 1217 (metal side) with the surface 1215 directly over the base layer 1210. FIG. 12d also shows that the surface 1217 is bonded to a carrier wafer 1228 for proper handling. The first upper layer 1220 electrically contacts the base layer 1210 with a conducting feature 1222 and a through-layer via 1224. FIG. 12e shows that the carrier wafer 1208 is detached from the base layer 1210. In an embodiment, if the probe pads 1206a and 1206b have been removed (or detached) at an earlier operation, they are re-attached to the surface 1207. With the base layer 1210, the first upper layer 1220 and the carrier wafer 1228 are bonded, as shown in FIG. 12e, test patterns for the layers, 1210 and 1220, are applied for testing the IC 114 pursuant to operation 1020 (FIG. 10).

Figures 12F, 12G:
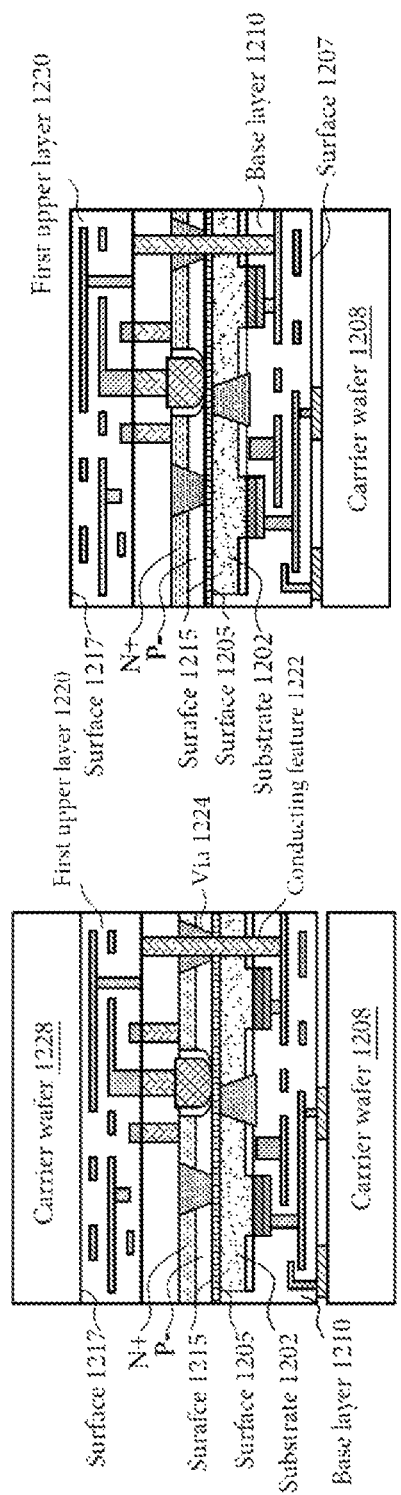

FIG. 12f shows that the base layer 1210 is bonded to the carrier wafer 1208 with the surface 1207 facing the carrier wafer 1208. FIG. 12g shows that the carrier wafer 1228 is detached from the first upper layer 1220 with the surface 1217 exposed for forming another upper layer directly over the first upper layer 1220.

FIG. 12h shows that a second upper layer 1230 is formed on the upper layer 1220. The second upper layer 1230 has two surfaces, 1225 (active region side) and 1227 (metal side), with the surface 1225 facing the first upper layer 1220. The second upper layer 1230 electrically contacts the first upper layer 1220 with a conducting feature 1232 and a through-layer via 1234. FIG. 12i shows that the carrier wafer 1228 is bonded to the second upper layer 1230 and the carrier wafer 1208 is detached from the base layer 1210. In an embodiment, if the probe pads 1206a and 1206b have been removed (or detached) at an earlier operation, they are re-attached to the surface 1207. With the base layer 1210, the first upper layer 1220, the second upper layer 1230 and the carrier wafer 1228 are bonded, as shown in FIG. 12i, test patterns for the layers, 1210, 1220 and 1230, are applied for testing the IC 114 pursuant to operation 1020 (FIG. 10).

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a monolithic stacked integrated circuit (IC) known-good-layer (KGL) path delay test circuit in a first layer of the IC wherein the first layer includes at least a portion of a critical path. The test circuit includes a flip-flop, the flip-flop having a data input, a data output and a clock input wherein the data input of the flip-flop is coupled to the at least a portion of the critical path to receive a first test data from the at least a portion of the critical path. The test circuit further includes a test clock input, coupled to the clock input of the flip-flop. The test circuit further includes a test input, to receive a second test data. The test circuit further includes a multiplexer. The multiplexer has two data inputs, a selection input, and a data output wherein one data input of the multiplexer is coupled to the test input and another data input of the multiplexer is coupled to the data output of the flip-flop. The test circuit further includes a test output, coupled to the data output of the multiplexer. The test circuit further includes a control element, coupled to the selection input of the multiplexer.

In another exemplary aspect, the present disclosure is directed to a monolithic stacked integrated circuit (IC) known-good-layer (KGL) path delay test pattern generation method. The method includes receiving a circuit design of the IC, wherein the circuit design includes a first layer, a second layer and a critical path. The critical path includes a first portion in the first layer and a second portion in the second layer. The first layer further includes a first flip-flop, the first flip-flop having a data input, a data output and a clock input wherein the data input of the first flip-flop is coupled to the first portion of the critical path. The first layer further includes a first test clock input, coupled to the clock input of the first flip-flop. The first layer further includes a test input and a multiplexer. The multiplexer has two data inputs, a selection input, and a data output wherein one data input of the multiplexer is coupled to the test input and another data input of the multiplexer is coupled to the data output of the first flip-flop. The first layer further includes a first test output, coupled to the data output of the multiplexer. The second layer further includes a second flip-flop, the second flip-flop having a data input, a data output and a clock input wherein the data input of the second flip-flop is coupled to the second portion of the critical path. The second layer further includes a second test clock input, coupled to the clock input of the second flip-flop. The second layer further includes a second test output and a means for coupling the second test output to the data output of the second flip-flop. The circuit design further includes a means for coupling the second test output to the test input. The method further includes configuring the selection input of the multiplexer thereby passing the data output of the first flip-flop to the first test output. The method further includes generating test patterns for detecting delay faults at the first layer.

In another exemplary aspect, the present disclosure is directed to a monolithic stacked integrated circuit (IC) delay fault testing method. The testing method includes receiving a base layer of the IC, wherein the base layer includes a substrate, the base layer has a first surface and a second surface, a plurality of probe pads are attached to the first surface and the probe pads electrically contact the base layer. The testing method further includes applying a first delay fault testing through the probe pads and bonding the first surface to a first carrier wafer. The testing method further includes forming an upper layer of the IC over the base layer, wherein the upper layer has a third surface and a fourth surface, the third surface is over the second surface and the upper layer electrically contacts the base layer through the third surface and the second surface. The testing method further includes detaching the first surface from the first carrier wafer and applying a second delay fault testing through the probe pads.

What is claimed is:

1. A monolithic stacked integrated circuit (IC) comprising a known-good-layer (KGL) path delay test circuit and at least a portion of a critical path in a first layer of the IC, the KGL path delay test circuit comprising:
   a flip-flop, the flip-flop having a data input, a data output and a clock input wherein the data input of the flip-flop is coupled to the at least a portion of the critical path to receive a first test data from the at least a portion of the critical path;
   a test clock input, coupled to the clock input of the flip-flop;
   a test input, to receive a second test data;
   a multiplexer, the multiplexer having two data inputs, a selection input, and a data output wherein one data input of the multiplexer is coupled to the test input and another data input of the multiplexer is coupled to the data output of the flip-flop;
   a test output, coupled to the data output of the multiplexer; and
   a control element, coupled to the selection input of the multiplexer.

2. The IC of claim 1, wherein the control element is one of: an input to the first layer and a programmable register in the first layer.

3. The IC of claim 1, wherein the control element is a register programmed using one of:
   a scan chain, the scan chain having the control element;
   an IEEE 1149.1 interface; and
   an IEEE 1500 interface.

4. The IC of claim 1, wherein the flip-flop is an end point of the at least a portion of the critical path.

5. The IC of claim 1, wherein:
   the first layer is a base layer of the IC;
   the test output is an IO pad of the IC; and the test clock input is one of: another IO pad of the IC and an output of an on-chip clock generation circuit.

6. The IC of claim 1, wherein:
the first layer is an upper layer of the IC; and
the IC has means for coupling the test clock input and the test output to a base layer of the IC.

7. The IC of claim 1, wherein:
the first layer is a topmost layer of the IC;
the test input, the multiplexer and the control element are degenerated; and
the test output is coupled to the data output of the flip-flop.

8. A monolithic stacked integrated circuit (IC) known-good-layer (KGL) path delay test pattern generation method, comprising:
receiving a circuit design of the IC, wherein:
the circuit design includes a first layer, a second layer and a critical path;
the critical path includes a first portion in the first layer and a second portion in the second layer;
the first layer further includes:
a first flip-flop, the first flip-flop having a data input, a data output and a clock input wherein the data input of the first flip-flop is coupled to the first portion of the critical path;
a first test clock input, coupled to the clock input of the first flip-flop;
a test input;
a multiplexer, the multiplexer having two data inputs, a selection input, and a data output wherein one data input of the multiplexer is coupled to the test input and another data input of the multiplexer is coupled to the data output of the first flip-flop; and
a first test output, coupled to the data output of the multiplexer;
the second layer further includes:
a second flip-flop, the second flip-flop having a data input, a data output and a clock input wherein the data input of the second flip-flop is coupled to the second portion of the critical path;
a second test clock input, coupled to the clock input of the second flip-flop;
a second test output; and
a means for coupling the second test output to the data output of the second flip-flop; and
the circuit design further includes a means for coupling the second test output to the test input;
configuring the selection input of the multiplexer thereby passing the data output of the first flip-flop to the first test output;
generating test patterns for detecting delay faults at the first layer.

9. The method of claim 8, further comprising:
configuring the selection input of the multiplexer thereby passing the second test output to the first test output; and
generating test patterns for detecting delay faults at the second layer.

10. The method of claim 9, wherein signal transitions are launched from the first flip-flop.

11. The method of claim 8, wherein the configuring the selection input of the multiplexer uses one of:
an input at the first layer;
a scan chain, the scan chain having a scan flip-flop at the first layer;
a first programmable interface at the first layer; and
a second programmable interface at the first layer, different from the first programmable interface.

12. The method of claim 8, wherein:
the first layer and the second layer are two adjacent layers of the IC; and
the first layer is one of: a base layer of the IC or an upper layer of the IC.

13. The method of claim 8, wherein the test clock inputs are coupled to one of: an IO pad of the IC and an output of an on-chip clock generation circuit of the IC.

14. A monolithic stacked integrated circuit (IC) known-good-layer (KGL) delay fault testing method, comprising:
receiving a base layer of the IC, wherein the base layer includes a substrate, the base layer has a first surface and a second surface, a plurality of probe pads are attached to the first surface and the probe pads electrically contact the base layer;
applying a first delay fault testing through the probe pads;
bonding the first surface to a first carrier wafer;
forming an upper layer of the IC over the base layer, wherein the upper layer has a third surface and a fourth surface, the third surface is over the second surface and the upper layer electrically contacts the base layer through the third surface and the second surface;
detaching the first surface from the first carrier wafer; and
applying a second delay fault testing through the probe pads.

15. The IC testing method in claim 14, further comprising, bonding the fourth surface to a second carrier wafer before applying the second delay fault testing.

16. The IC testing method in claim 14, further comprising:
detaching the probe pads before the bonding the first surface to the first carrier wafer; and
attaching the probe pads to the first surface before applying the second delay fault testing through the probe pads.

17. The IC testing method in claim 14, wherein the substrate includes silicon.

18. The IC testing method in claim 14, wherein the first surface is a surface of the substrate.

19. The IC testing method in claim 14, wherein the probe pads electrically contact the base layer using one of:
through-silicon vias;
through-layer vias; and
conducting features on the first surface.

20. The IC testing method in claim 14, wherein:
the IC includes KGL path delay test circuits in at least the base layer; and
the first and the second delay fault testing use KGL path delay test patterns.

* * * * *